Figure 1:
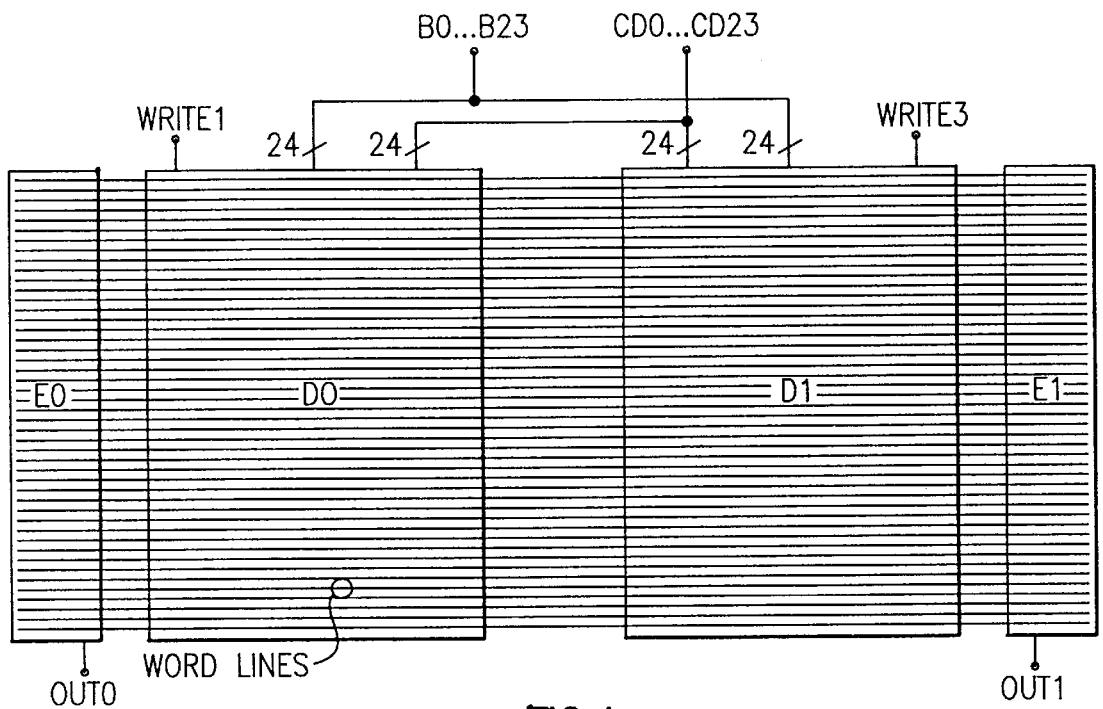

United States Patent

Helwig et al.

[11] Patent Number: 5,870,324
[45] Date of Patent: Feb. 9, 1999

[54] CONTENTS-ADDRESSABLE MEMORY

[75] Inventors: Klaus Helwig, Weil Schönbuch; Christoph Wandel, Stuttgart, both of Germany

[73] Assignee: International Business Machines Corporation, Armonk, N.Y.

[21] Appl. No.: 750,765
[22] PCT Filed: Apr. 18, 1995
[86] PCT No.: PCT/EP95/01460
  § 371 Date: Mar. 7, 1997
  § 102(e) Date: Mar. 7, 1997
[87] PCT Pub. No.: WO96/33499
  PCT Pub. Date: Oct. 24, 1996
[51] Int. Cl.$^6$ ................................................ G11C 7/00
[52] U.S. Cl. ................... 365/49; 365/230.03; 365/238.5
[58] Field of Search ........................ 365/49, 230.03, 365/238.5, 189.01

[56] References Cited

U.S. PATENT DOCUMENTS 5,280,447  1/1994  Hazen et al. .................. 365/230.03
5,564,052  10/1996  Nguyen et al. .......................... 365/49

*Primary Examiner*—Vu A. Le
*Attorney, Agent, or Firm*—Lynn L. Augspurger

[57] ABSTRACT

The invention relates to a contents-addressable memory (CAM) with multiple logical-memory arrays Di. The logical-memory arrays Di are distributed logically in multiple blocks Dij. The blocks Dij are physically arranged to memory arrays Di' and integrated on the chip surface. Each memory array Di' hereby has one block Dij of the logical memory arrays Di. In this way, parasitic capacities of the CAM may be minimized.

3 Claims, 5 Drawing Sheets

CONTENTS-ADDRESSABLE MEMORY

The invention relates to a contents-addressable memory (CAM) in accordance with the general concept of Patent Claim 1.

Contents-addressable memories-hereinafter abbreviated as CAM—have many applications in the present state of the art in electronic circuits, especially in computer systems. Unlike a typical memory module, addressing of a memory cell in a CAM does not occur through its address. Instead, a data word is entered into a CAM which does not represent an address, but rather the possible contents of a memory location in the CAM. If there is a memory location in the CAM in which the entered data word is stored, then the CAM delivers a corresponding signal. Examples for different embodiments of CAMs and their application may be found in TDB Vol. 37, No. 6B, June 1994, pp. 347–348
TDB Vol. 37, No. 4B, April 1994, pp. 125–128
TDB No. 1, January 1993, pp. 200–202
TDB No. 4a, September 1991, pp. 154–157
TDB No. 10B, March 1991, pp. 164–168
TDB December 1988, pp. 254–257
TDB March 1984, pp. 5364–5366
TDB March 1973, pp. 3002–3004
TDB December 1973, pp. 2217–2219
TDB August 1974, pp. 882–883
TDB September 1974, pp. 1058–1059
TDB October 1981, pp. 2601–2603
TDB August 1989, pp. 478–479
TDB March 1989, pp. 461–466.

It is therefore the object of the invention to create an improved CAM. It is especially the objective of the invention to make a CAM available which has a lower accessing time.

The object of the invention is achieved through the features of the characterizing section of Claim 1. In accordance thereto, the logical memory arrays of a CAM are not identical with the physical memory arrays of the CAM as they are integrated on the surface of the chip. Instead, the logical memory arrays are logically distributed in blocks. Each block of a logical memory array is integrated with the corresponding blocks of other memory arrays into a physical memory array. Through this, it is possible to minimize not only the line lengths of the signal connections of the CAM but also of the internal signal lines of the CAM, and as a result to increase processing speed.

Preferred embodiments of the CAM in accordance with the invention may be found in the sub-Claims.

An embodiment of the invention is represented in the drawings and is described here in more detail.

Depicted are

Figure 2:
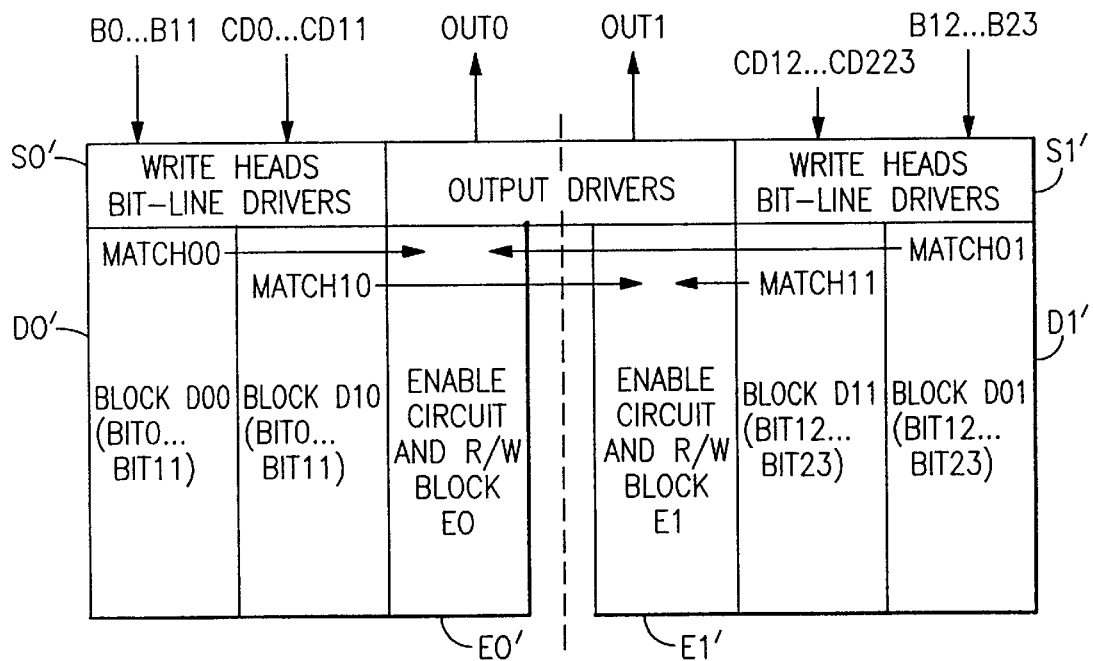
Figure 3:
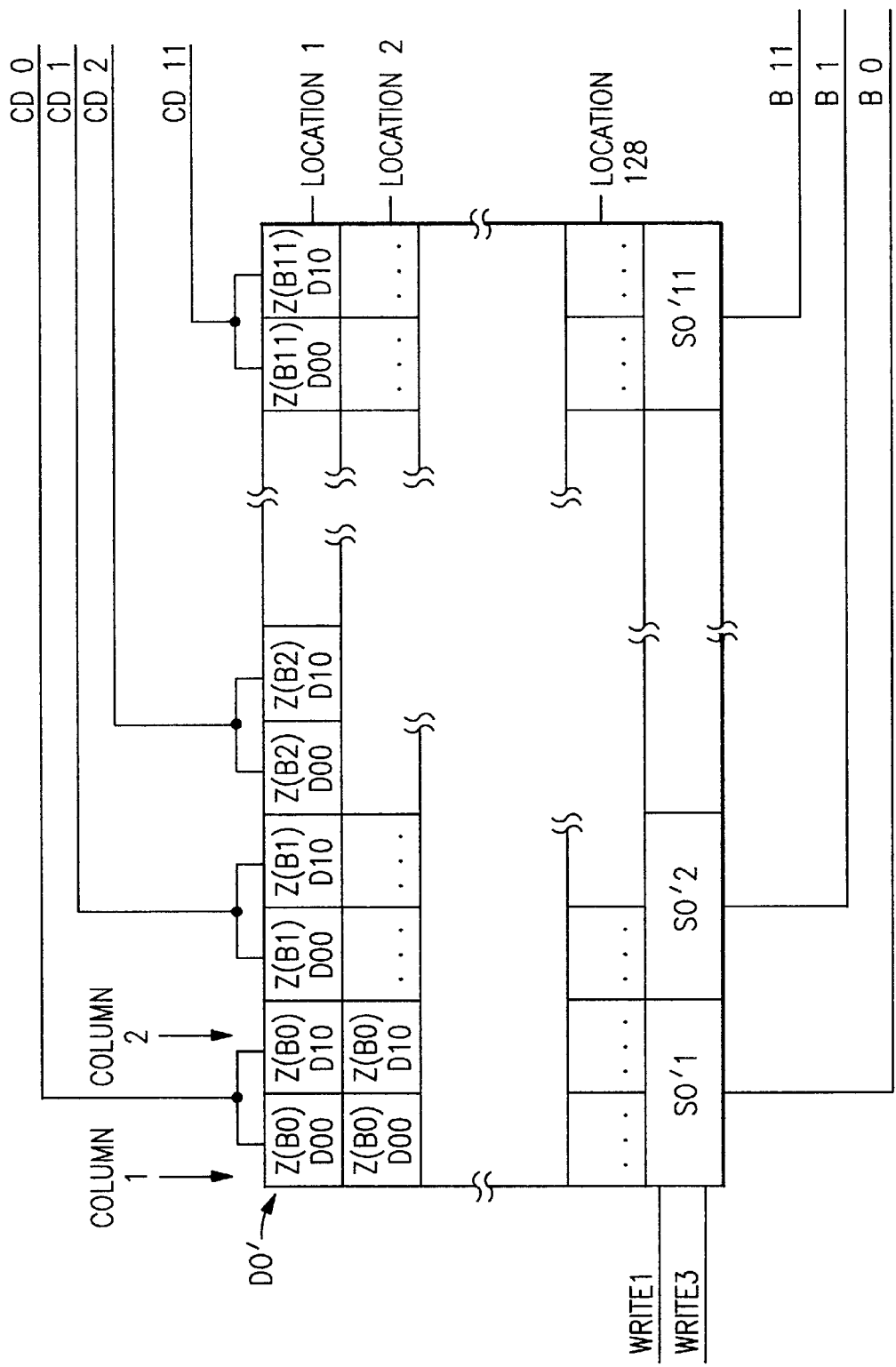
Figure 4:
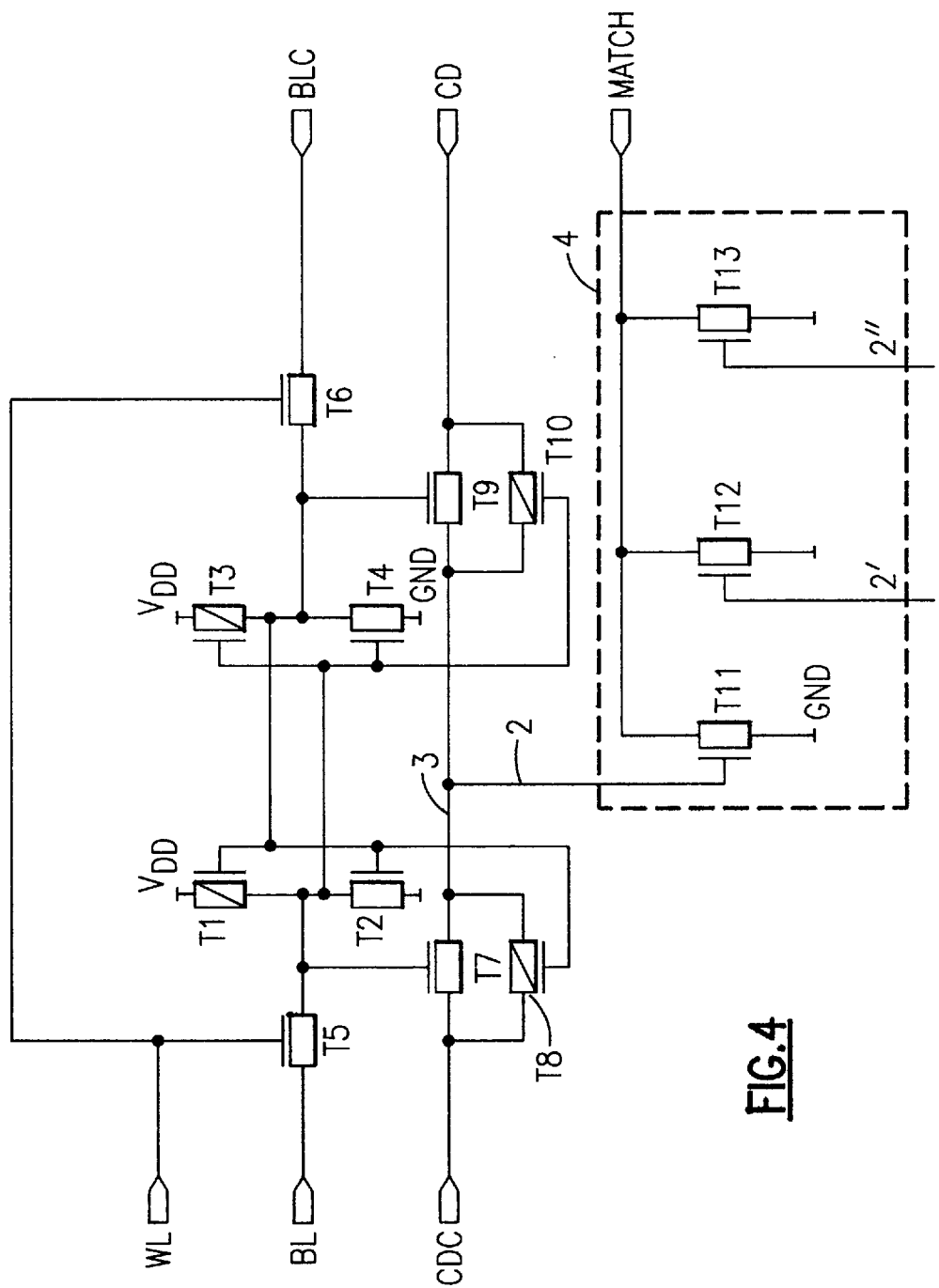
Figure 5:
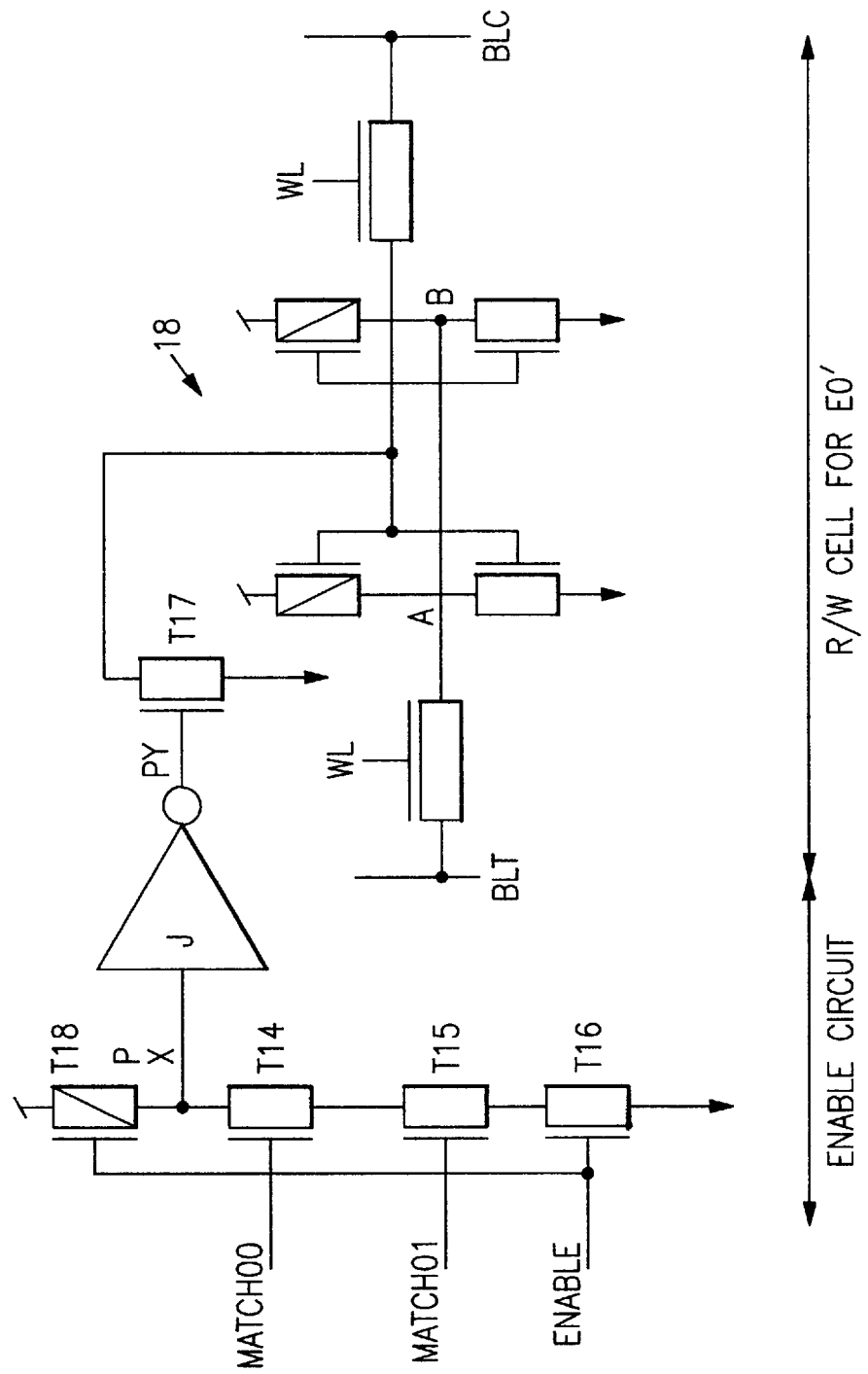
Figure 6:
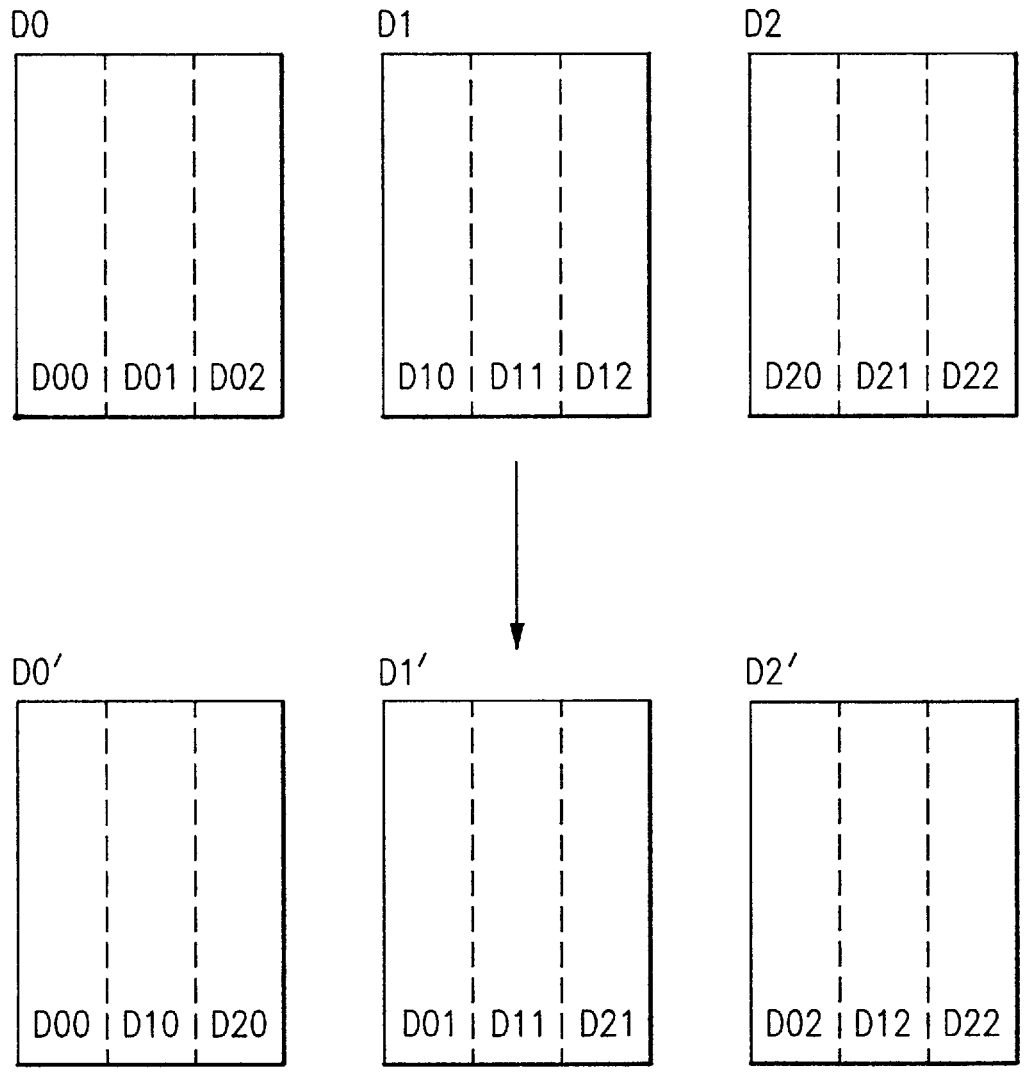

FIG. 1 a CAM according to the current state of the art;

FIG. 2 a schematic diagram representation of a CAM in accordance with the invention;

FIG. 3 a memory array consisting of 2 logical blocks of a CAM in accordance with the invention;

FIG. 4 the circuit of a memory cell and the signal lines belonging thereto;

FIG. 5 the logical connection of two match lines;

FIG. 6 in a schematic representation, the correspondence of logical memory arrays and physical memory arrays in a CAM in accordance with the invention with 3 logical memory arrays which are respectively divided into 3 blocks.

The CAM represented in FIG. 1, which is known in the current state of the art, is divided into the two memory arrays D0 and D1. The memory arrays D0 and D1 are essentially identical; the memory arrays D0 and D1 each have 128 memory locations, whereby each memory location can store a data word with a length of 24 bits. The memory arrays D0 and D1 are each electrically linked with the input lines B0–B23. The input lines B0–B23 serve for transfer of written data with word lengths of 24 bits. Furthermore, the memory array D0 has a signal input WRITE 1, and the memory array D1 has a signal input WRITE 3. If a data word which is transferred to the CAM through the input lines B0–B23 has been written into the CAM, then the signal inputs WRITE 1 and WRITE 3 serve to determine in which of the memory arrays D0 or D1 the data word shall be stored.

The memory arrays D0 and D1 are each electrically linked with the compare lines CD0–CD23. A 24-bit wide data word may be transferred to the CAM through the compare lines CD0–CD23. A data word transferred to the CAM by the compare lines CD0–CD23 is compared to the data words previously written into the CAM. If all 24 bits of a stored data word agree with the comparison word, the CAM creates a match signal. The match signal therefore indicates that the comparison word transferred through the lines CD0–CD23 had already been stored in the CAM as a data word before the comparison process. The match signal is stored in one of the read/write memories E0 or E1 belonging to the CAM. The match signal will be stored in the read/write memory E0 if the data word which agrees with the comparison word is located in memory array D0, otherwise it is stored in the read/write memory E1, which belongs to the memory array D1. The memory address of the match signal within the read/write memory E0 or E1 is thereby representative of the address of that location in the memory array D0 or D1 whose data word agrees with the comparison word. The read/write memories E0 and E1 may be read out from their outputs Out0 or Out1, in order to evaluate the results of a comparison. The individual memory locations of the memory arrays D0 and D1 are symbolized in FIG. 1 by their corresponding word lines.

In the circuit shown in FIG. 1, as it is known in the current state of the art, it has proven to be disadvantageous that, for linking the memory arrays D0 and D1 with the input lines D0–D23 and the compare lines CD0–CD23, these must each be lead in parallel to the memory array D0 as well as to the memory array D1. The corresponding branching of the respective 24 lines creates a total of a large line length necessary for the input and compare lines. Based on the circuit performance is it is thereby conditioned, the access speed of the CAM is limited.

In addition, it has been proven as disadvantageous with the circuit in FIG. 1 that the match lines which link the memory array D0 with its read/write memory E0, or the memory array D1 with its read/write memory E1, must each be lead across the entire width of the memory arrays D0 or D1. The circuit performance resulting from this again limits the processing speed.

These disadvantages are remedied with the CAM in accordance with the invention as depicted in FIG. 2. The CAM depicted in FIG. 2 consists of the memory arrays D0' and D1'. The memory array D0' contains the two blocks D00 and D10. The block D00 corresponds to the bit positions 0–11 of the memory array D0 in FIG. 1. The block D10 on the other hand corresponds to the bit positions 0–11 of the memory array D1 in FIG. 1. The memory array D1' contains the blocks D01 and D11, which each correspond to the bit positions 12–23 of the memory arrays D0 or D1 of FIG. 1.

A location with a width of 24 bits, for example the memory array D0 of FIG. 1, is therefore divided into two halves in the CAM of FIG. 2. The bit positions 0–11 are implemented in the block D00, and the bit positions 12–23 are implemented in the block D01, each of which belong to the different memory arrays D0' and D1'.

The memory arrays D0' and D1' are each electrically linked through bit line drivers and write heads S0' or S1' with the input lines B0–B11 and the compare lines CD0–CD1, or with the input lines B12–B23 and the compare lines CD12–CD23. A read/write memory block E0' belongs to the memory array D0'; a read/write memory block E1' belongs to the memory array D1'. The read/write memory blocks E0' and E1' each have an enable circuit, which allow writing in a read/write cell of one of the blocks D0' or E1' respectively. Each of the blocks D00, D01, D10 and D11 is linked through corresponding match lines MATCH00, MATCH01, MATCH10 and MATCH11 with the enable circuits. Each location with 12-bit positions of one of the blocks D00, D01, D10 and D11 thereby has a separate match line. If an agreement between the corresponding bit positions of a comparison word and the bit positions of one of the blocks is determined, then a signal which indicates the agreement is issued on the corresponding match line. The match lines of those blocks, which logically form a memory array but are actually arranged in the different memory arrays D0' and D1', serve respectively as inputs to the same enable circuit of one of the read/write memory blocks. Correspondingly, the match lines MATCH00 and MATCH01 of the blocks D00 and D01 are connected at the corresponding enable circuits of the read/write memory block E0', and the match lines MATCH 10 and MATCH11 of the blocks D10 and D11 are connected to the corresponding enable circuits of the read/write memory block E1'. The match lines MATCH00 and MATCH01, or MATCH10 and MATCH11, are linked logically in an AND-operation in the enable circuits. Only when both of the match lines MATCH00 and MATCH01, or MATCH10 and MATCH11, indicate respectively that the corresponding bit positions of the comparison data on the match line correspond to those bits stored in the blocks of a data word, is the corresponding enable circuit activated for that location in the blocks in which the agreement was determined. The information of the agreement of the comparison data and a stored data word is then written into a corresponding read/write cell of one of the read/write blocks E0' or E1'. This information can then be read out through the output lines Out0 and Out1 which are linked with the read/write blocks E0' or E1' through output drivers.

The CAM in accordance with the invention depicted in FIG. 2 therefore has 2 logical memory arrays, which consist of the blocks D00 and D01, or of the blocks D10 and D11. The logical memory arrays which are formed by the blocks D00 and D01, or the blocks D10 and D11, correspond to the memory arrays D0 and D1 of FIG. 1. The blocks which are logically associated are nonetheless arranged on the chip surface separately from one another in the different memory arrays D0' and D1'. This has the advantage that it is not necessary to lead 24 input lines and match lines respectively to each of the two memory arrays D0' and D1', as is the case with the CAM depicted in FIG. 1. It is sufficient here to lead only the input lines B0–B11 and CD0–CD11 or B12–B23 and CD12–CD23, which correspond respectively to the bit positions 0–11, or 12–23, to the corresponding memory arrays D0' and D1'. Through this, the total line length of the leads and thus the lead capacity is minimized. As a result of this, the processing speed of the CAM in accordance with the invention is increased.

A further advantage resulting from this is that the match lines no longer must each be lead across the entire width of the memory arrays as with the CAM of FIG. 1. Especially the match lines MATCH10 and MATCH11 are shortened compared to the state of the art, since they each cover only 11-bit positions, and corresponding to this the required line length to the read/write memory block E1' is less.

An implementation possibility of the memory array D0' depicted in FIG. 2 is schematically represented in FIG. 3. The memory array D0' consists of 128 memory locations. Each of the 128 memory locations has 24 memory cells Z. The blocks D00 and D10, which logically belong to the different memory arrays D0 or D1, are implemented within the memory array D0'. Location 1 of the memory array D0' serves for storing the bit positions 0–11 of the respective first location of the blocks D00 and D10. The same is analogously true for the remaining locations of the memory array D0'. The memory cells of the blocks D00 or D10 are alternately arranged within a location. That means that, after a memory cell Z for a bit position of the block D00, the corresponding memory cell Z for the same bit position of the block D10 spatially follows. From this, the following series of memory cells results for location 1 of the memory array D0', whereby the memory cell for the bit 0 of the block D00 is designated as Z (B0, D00), as an example:

Z(B0), D00; Z(B0), D10; Z(B1), D00; Z(B1), D10; Z(B2), D00; Z(B2), D10; . . . ; Z(B11), D00; Z(B11), D10.

Each of the columns of the memory array D0' is linked with one of the associated compare lines CD. As an example, column 1 of the memory array D0' contains memory cells Z(B0) of the block D00, which serve for storage of the first bit of the data words in block D00. Correspondingly, column 1 is electrically linked with the compare line CD0. Column 2 of the memory array D0', which serves for storage of the respective first bits of the data words of block D10, is likewise electrically linked with the corresponding compare line CD0. Since columns 1 and 2 respectively serve for storage of the first bit of a data word, and since these columns are located directly adjacent to one another in the memory array D0', it is possible to configure the compare line CD0 in a simple manner and to link it electrically at its end with both columns 1 and 2. This electrical linking is symbolized by the wire link 1 in FIG. 3. The remaining compare lines CD1 to CD11 are configured in a correspondingly simple manner, and are each linked with 2 adjacent columns which serve for storage of the same bit positions in the different blocks D00 or D10. The total line length of the compare lines CD which is required is thus significantly reduced in comparison to the current state of the art.

For each of 2 adjacent columns, for example column 1 and 2, the memory array D0' has a write head with a bit line driver, for example S0'. A write head with bit line driver S0' always belongs to 2 adjacent columns of the memory array D0' which serve for storage of the same bit positions in the different blocks D00 or D10. The write heads and bit line drivers S0' are linked with the signal inputs WRITE1 and WRITE3 of the memory array D0', which correspond to the analogous signal inputs WRITE1 and WRITE3 of FIG. 1. Furthermore, each write head S0' is linked with a corresponding input line B. For example, the write head S0' 1 is linked with the input line B0 which serves for transfer of the first bit position, and correspondingly, the write head S0' 2 is linked with the input line B1 for the second bit position. If a data word is written into the CAM through the input lines B0–B23, then the first 12 bits of the data word are transferred through the input lines B0–B11 to the corresponding write heads S0' 1 to S0' 11 of the memory array D0'. Corresponding to the input signals WRITE1 and WRITE3, which are created by the computer system, the data which are then on the input lines B0–B11 are either stored in block D00 or block D10. This function may be implemented by a three-state transistor in each of the write heads S0', for example. The division of the logical memory arrays D0 and D1 into the blocks D00 and D10, and their arrangement in a memory array D0', makes it possible to configure the input lines B0–B11 very simply, as with the compare lines CD0–CD11, and thereby to reduce line length.

The memory array D1', which is not depicted in FIG. 3, is structured correspondingly to the memory array D0', with the difference that the bit positions 12–23 of the blocks D01 and D11 are provided there. There is a resulting corresponding economy in line length of the compare lines CD12–CD23 and the input lines B12–B23.

FIG. 4 depicts an illustration of the structure of a memory cell Z in accordance with the invention, for example of the cells Z(B0, B00) of the memory array D0', as represented in FIG. 3. In the embodiment depicted in FIG. 4, the memory cell itself is configured as a flip-flop consisting of the 4 transistors T1, T2, T3 and T4. The flip-flop is linked with the transistors T5 and T6. The bases of the transistors T5 and T6 are linked with the word line WL. A connector of the transistor T5 is linked with the bit line BL, while a connector of the transistor T6 is linked with the complementary bit line BLC. As is known in the current state of the art, the flip-flop, which consists of the 4 transistors T1, T2, T3 and T4, may be described by a corresponding control of the word line WL and the bit line BL as well as their complement.

A compare line CD, for example the compare line CD0, as with the memory cell Z of FIG. 4 of one of the memory cells Z (B0, B00), is linked with the line end of a transistor T9, while the complement of the compare line CD—the line CDC—is linked with a line end of a transistor T7. The base of the transistor T9 is linked with the common line end of the transistors T3 and T4, while the base of the transistor T7 is linked with the common line end of the transistors T1 and T2 of the flip-flop. The transistors T8 and T10 respectively are switched parallel to the transistors T7 and T9. The base of the transistor T8 is linked with the bases of the transistors T1 and T2, while the base of the transistor T10 is linked with the bases T3 and T4 of the flip-flop. In the case of the transistors T1, T3, T8 and T10, the transistors are of the normally-on type, that is, they are transistors which are conductive with a potential of 0 volts at the base. The remaining transistors depicted in FIG. 4 are normally-off transistors, which are not conductive with a 0 potential at the base.

The transistors T7 and T9 are linked to one another through a line 3. The line 3 is in turn linked through a line 2 with the base of a transistor 11. The signal on the line 3 is logical 0 when the comparison data-item on the line CD agrees with the data-item stored in the memory cell Z; in the opposite instance, the signal on the line 3 is logical 1 when the data-item on the compare line CD does not agree with the data-item stored in the flip-flop. The signal of line 3 is transferred through line 2 to the base of the transistor T11. One end of the transistor T11 is linked with GROUND, the other end is linked with a MATCH line. Before a comparison operation, the MATCH line is pre-loaded to logical 1. If the comparator data-item agrees with the data-item stored in the cell Z, then the result is a signal level of logical 0 on the line 2, so that the transistor T11 does not remain conductive. For each of the cells Z of a location of the block D00, an additional transistor T12,T13, . . . is linked with the MATCH line. Through this, a match circuit 4 is realized, to which the transistors T11, T12, T13, . . . belong. The bases of the transistors T12, T13, . . . are respectively linked through lines 2' or 2" with the lines corresponding to line 3 of their respective memory cells Z. When all 12 bits of a comparator word on the compare lines CD0–CD11 agree with the corresponding bit positions 0–11 of a data word stored in a memory location of a block Dj-in the example block D00-then this has as a result that the respective signal on the lines 2, 2', 2", . . . of the transistors of the match circuit 4 is logical 0, so that none of the transistors of the match circuit 4 becomes conductive. If there is no agreement between comparison data and stored data for one of the bit positions 0–11, then this has the result that one of the transistors of the match circuit 4 becomes conductive, so that the match line correspondingly becomes logical 0, which indicates that no agreement between the comparison word and the data word exists.

For each location of the memory array D0' there are each therefore 2 match circuits 4, specifically a match circuit 4 for each of the blocks D00 and D10. The match circuits 4 of the block D00 have correspondingly the signal-line inputs 2, 2', 2". . . of the memory cells Z (B0, D00); Z (B1, D00); . . . Z (B11, D00). A match line MATCH00 belongs correspondingly to each location, which also indicates that the first 12 bits of a comparison word agree with the first 12 bits of a data word stored in a location of the memory array D0'. The corresponding situation is true for the match lines MATCH10 of the block D10, as well as for the further match lines MATCH01 and MATCH11.

FIG. 5 depicts the logical link through the example of the match lines MATCH00 and MATCH01 of the blocks D00 and D01 (compare to FIG. 2). When the bit positions 0–11 as well as the bit positions 12–23 of the comparison word agree with the corresponding bit positions of a stored data word, then the match line MATCH00 as well as the match line MATCH01 of the corresponding location are at the logical 1 potential. The match line MATCH00 is connected at the base of a transistor T14, and the match line MATCH01 is connected at the base of a transistor T15. The transistors T14 and T15 are connected with each other. The transistor T15 is furthermore linked with a transistor T16 and the transistor T14 is linked with a normally-on transistor T18. The bases of the transistors T16 and T18 are linked with an enable signal ENABLE. When the ENABLE signal is logical 1, then the MATCH00 and MATCH01 signals are logically connected in an AND-operation through the transistors T14 and T15. The transistors T14 and T15 both become conductive only when both match lines MATCH00 and MATCH01 are on a logical 1 potential, so that the potential at point PX becomes 0. As a result of this, the potential at point PY, that is, at the output of the inverter I, then becomes logical 1, so that the transistor T17 becomes conductive. The corresponding information is thus written into the flip-flop 18. The flip-flop 18 is a read/write cell of the read/write memory block E0'. The circuit depicted in FIG. 5, which consists of the enable circuit, the logical AND-operation of the match lines, and the read/write cell of the memory block E0' is implemented for each of the 128 locations of the CAM. The read/write memory block E0' is realized through the total of the read/write cells. This is analogously true for the read/write memory block E1'. After the conclusion of a comparison process, the read/write memory blocks E0' and E1' may be read out in order to ascertain whether the information that the comparison data agree with the stored data of the memory location concerned is stored in one of the flip-flops 18 of one of the locations of the CAM. If this information is stored in the read/write memory block E0', this means that the corresponding data word is located in the logical memory array D0, that is, in the block D00 of the memory array D0' and the block D01 of the memory array D1'.

A further benefit results from the division of the match lines into a match line MATCH00 and MATCH01 or MATCH10 and MATCH11 in accordance with the invention. Specifically, if the comparison word and the data word do not agree in only one bit, this means that one of the transistors of the match circuit 4 must pull in total the match line MATCH to the potential logical 0, which makes necessary the charge exchange of a relatively high capacity. However, in accordance with the theory of the invention, transistors T11, T12, T13, . . . are not provided with a match line MATCH for each bit of the data word, but rather—in the embodiment depicted in FIG. 4—only 12 transistors, based on the bi-partition of the logical memory arrays D0 and D1 respectively into 2 blocks D00, D01, D10 and D11. The reduction of the charge-exchange capacity related to this means a further increase in the processing speed of the CAM.

The theory of the invention is, however, not limited to one CAM with 2 logical memory arrays D0 and D1, which are respectively divided into 2 blocks D00, D01 and D10, D11. Instead, the theory of the invention is applicable to a CAM with an arbitrary number X of logical memory arrays D0, D1, D2, . . . . Each of the logical memory arrays Di is here logically divided into a number Y of blocks Dij. Mutually-corresponding blocks Dij of different logical memory arrays Di are arranged to memory arrays Di', in accordance with the theory of the invention. FIG. 6 depicts this as an example with the illustration of three logical memory arrays D0, D1, D2, which are each divided into Y=3 blocks. Here, those blocks of the different logical memory arrays which have the same bit positions within a logical memory array correspond to one another. The blocks which correspond to one another are each arranged physically on the surface of the chip in a memory array Di', that is, D0', D1', D2'. Correspondingly, this means that every block of a physical memory array Di' has a separate match line for every memory location.

In the more general embodiment depicted in FIG. 6, the bit positions of the respective blocks of a memory array, for example the blocks D00, D10, D20 of the memory array D0', are arranged alternately in the locations of the memory array. The first 3 memory cells of the memory array D0' may contain respectively the first bit position of the blocks B00, B10 and B20. This corresponds to the representation in FIG. 3 for an instance of 2 blocks per memory array. Therefore, in the memory array D0' of Figure, in each case triples of the memory cells are formed, which respectively serve for storage of the same bit position of different blocks. The remaining locations of the memory array D0' are constructed analogously. The corresponding is true for the memory arrays D1' and D2'. The individual memory cell is constructed as in the embodiment of FIG. 4. Differing from the embodiment in FIG. 4, the match circuit 4 contains only a number of transistors T11, T12, T13, . . . , which corresponds to one third of the word-width of a data word which is to be stored in the CAM of FIG. 6. The reason for this is that, based on the logical tripartite division of the memory array, each block Dij only has one third of the total word-width. The match circuits of those blocks which belong to a logical array, are linked in an AND-operation corresponding to FIG. 5; hence there will not be an actual agreement of the comparison word with the entire data word until all of the match lines of the blocks which belong to a common logical array indicate that the comparison word agrees with the corresponding bit positions of the respective blocks. Correspondingly, a read/write memory block E01, E1', E2' is provided for each of the memory arrays D0', D1', D2'.

Through the division of the logical memory arrays into Y=3 blocks in accordance with the invention, the benefit corresponding to the embodiment of FIG. 2 is also achieved that the line lengths of the compare lines as well as of the input lines and the match lines can be minimized. Also, the capacities of the match lines are again reduced, since a transistor at each of the match lines is not provided for each bit position.

As an example, a CAM in accordance with the invention may be applied as a cache directory. A cache memory may, for example, have a use in conjunction with a mass memory, especially with a hard-disk memory. Those sectors which must be frequently accessed, for example those of a hard-disk memory, are stored in corresponding sectors of the cache memory. If the data which are stored in a sector of the memory are to be accessed, then it must first be ascertained whether the data of this sector are present in the cache memory or not. For this, the address of the corresponding sector is entered through the compare lines to the CAM. When the corresponding sector number is stored in the CAM as a data word, this means that the data belonging to the sector number are stored in the cache memory. That location of the CAM in which the sector number was detected represents the corresponding sector number in the cache memory. Correspondingly, the input lines B are used to write sector numbers of sectors of the hard disk into the CAM, as soon as the data of a memory sector of the hard disk are available in the cache memory.

We claim:

1. A contents-addressable memory with two logical memory arrays characterized in that said contents-addressable memory is arranged on a memory chip with the logical memory arrays each logically divided into two physical memory blocks which are arranged apart on said memory array.

2. A contents-addressable memory according to claim 1, characterized in that a match circuit is provided for each of the blocks and that the match circuits of those blocks which belong logically to the memory array are logically linked to one another.

3. A contents-addressable memory according to claim 2, characterized in that the logical linking of the match circuits is a logical AND operation.

* * * * *